(12) United States Patent
Narag et al.

(10) Patent No.: US 9,754,869 B2
(45) Date of Patent: Sep. 5, 2017

(54) LIGHT EMITTING SEMICONDUCTOR DEVICE AND SUBSTRATE THEREFORE

(71) Applicant: 3M INNOVATIVE PROPERTIES COMPANY, St. Paul, MN (US)

(72) Inventors: Alejandro Aldrin II Agcaoili Narag, Singapore (SG); Ravi Palaniswamy, Singapore (SG); Bee Leng Tan, Singapore (SG); Antonny Enojo Flor, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/651,533

(22) PCT Filed: Mar. 13, 2013

(86) PCT No.: PCT/US2013/030657
§ 371 (c)(1),
(2) Date: Jun. 11, 2015

(87) PCT Pub. No.: WO2014/113045
PCT Pub. Date: Jul. 24, 2014

(65) Prior Publication Data
US 2015/0318237 A1    Nov. 5, 2015

Related U.S. Application Data

(60) Provisional application No. 61/753,223, filed on Jan. 16, 2013.

(51) Int. Cl.
*H01L 23/49* (2006.01)
*H01L 33/62* (2010.01)
(Continued)

(52) U.S. Cl.
CPC .... *H01L 23/49838* (2013.01); *H01L 23/4985* (2013.01); *H01L 23/49827* (2013.01);
(Continued)

(58) Field of Classification Search
CPC ......... H01L 21/58; H01L 23/10; H01L 23/34; H01L 33/62; H01L 33/64; H01L 23/49; H01L 23/49838; H01L 23/49827; H01L 23/4985; H01L 23/49866; H01L 23/49894; H01L 33/486
See application file for complete search history.

(56) References Cited

U.S. PATENT DOCUMENTS

| 2003/0072153 A1 | 4/2003 | Matsui | |
| 2003/0179548 A1* | 9/2003 | Becker | H05K 1/0204 361/704 |
| 2007/0120089 A1 | 5/2007 | Mao | |

(Continued)

FOREIGN PATENT DOCUMENTS

| JP | 2012-079748 | 4/2012 |
| KR | 2008-0051367 | 6/2008 |

(Continued)

OTHER PUBLICATIONS

International Search Report for PCT International Application No. PCT/US2013/030657, mailed on Sep. 26, 2013, 4 pages.

*Primary Examiner* — Fazli Erdem
(74) *Attorney, Agent, or Firm* — Clifton F. Richardson; Melanie G. Gover

(57) ABSTRACT

Provided is an article for supporting an LESD comprising a dielectric layer having a first major surface with a conductive layer thereon and a second major surface, the dielectric layer having at least three vias extending from the second major surface to the first major surface, the conductive layer comprising at least first and second conductive features, wherein the first conductive feature is adjacent an opening of at least a first via and the second conductive feature is adjacent an opening of at least a second and a third via.

18 Claims, 3 Drawing Sheets

(51) Int. Cl.
*H01L 33/64* (2010.01)
*H01L 23/498* (2006.01)
*H01S 5/022* (2006.01)
*H01L 33/48* (2010.01)

(52) U.S. Cl.
CPC .. *H01L 23/49866* (2013.01); *H01L 23/49894* (2013.01); *H01L 33/486* (2013.01); *H01L 33/62* (2013.01); *H01L 33/64* (2013.01); *H01S 5/02272* (2013.01); *H01S 5/02276* (2013.01); *H01L 2224/48091* (2013.01); *H01L 2924/12032* (2013.01)

(56) References Cited

U.S. PATENT DOCUMENTS

| | | | |
|---|---|---|---|
| 2008/0029879 A1* | 2/2008 | Tuckerman | H01L 31/0203 257/704 |
| 2008/0099770 A1* | 5/2008 | Mendendorp | H01L 33/64 257/79 |
| 2011/0031509 A1 | 2/2011 | Kirihara | |
| 2011/0241061 A1 | 10/2011 | Yu et al. | |
| 2013/0087367 A1* | 4/2013 | Imai | H01L 33/647 174/252 |
| 2013/0320390 A1 | 12/2013 | Palaniswamy et al. | |

FOREIGN PATENT DOCUMENTS

| | | |
|---|---|---|
| KR | 2011-0129169 | 12/2011 |
| KR | 2012-0063703 | 6/2012 |
| TW | 201135884 | 10/2011 |
| TW | 201251153 | 12/2012 |
| WO | WO 2012-061010 | 5/2012 |

\* cited by examiner

LIGHT EMITTING SEMICONDUCTOR DEVICE AND SUBSTRATE THEREFORE

TECHNICAL FIELD

This invention relates to flexible light emitting semiconductor devices and related substrates.

BACKGROUND

Conventional light emitting semi-conductor (LES), including light emitting diodes (LEDs) and laser diodes, and LES devices (LESD) and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by buildup of heat generated from within the devices, as well as heat from sunlight in the case of outside lighting applications. Excessive heat buildup can cause deterioration of the materials used in the LES devices, such as encapsulants for the LESDs. When LESDs are attached to flexible-circuit laminates, which may also include other electrical components, the heat dissipation problems can be greatly increased.

SUMMARY

At least one aspect of the present invention provides a cost-effective thermal management solution for current and future high power LESD constructions through a robust flexible LESD construction. The ability to dissipate large amounts of heat is needed for the operation of high power LESD arrays. According to at least one embodiment of the present invention, heat dissipation can be managed by integrating the LESDs into a system having a flexible dielectric layer that employs a via to accomplish better heat management. In at least some embodiment of the present invention, to create the vias, etching through the dielectric layer is performed.

At least one embodiment of the present invention provides a support article comprising a dielectric layer having a first major surface with a conductive layer thereon and a second major surface, the dielectric layer having at least three vias extending from the second major surface to the first major surface, the conductive layer comprising at least first and second conductive features, wherein the first conductive feature is adjacent an opening of at least a first via and the second conductive feature is adjacent an opening of at least a second and a third via.

As used in this application:

"LES" means light emitting semiconductor(s), including light emitting diodes and laser diodes;

"LESD" means light emitting semiconductor devices, including light emitting diode device(s) and laser diode device(s); an LESD may be a bare LES die construction, a complete packaged LES construction, or an intermediate LES construction comprising more than the bare die, but less than all the components for a complete LES package, such that the terms LES and LESD may be used interchangeably and refer to one or all of the different LES constructions; a "discrete LESD" typically refers to one or more LESDs that are "packaged" and ready to function once connected to an electrical source, such as driving circuits including MCPCBs, MISs, etc. Examples of discrete LESDs that may be suitable for use in embodiments of the present invention Golden DRAGON LEDs, available from OSRAM Opto Semiconductors GmbH, Germany; LUXEON LEDs, available from Philips Lumileds Lighting Company, USA; and XLAMP LEDs, available from Cree, Inc., USA, as well as the discrete LESDs described herein and similar devices.

"support article" means a circuitized flexible article to which one or more discrete LESDs are attached; commercially available alternatives to the support article of the present invention may include metal core printed circuit boards (MCPCBs), metal insulation substrates (MIS), Bergquist thermal boards, and COOLAM thermal substrates;

"flexible LESD" typically refers to a support article having one or more attached discrete LESD.

The above summary of the present invention is not intended to describe each disclosed embodiment or every implementation of the present invention. The Figures and detailed description that follow below more particularly exemplify illustrative embodiments.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc.

Exemplary embodiments of the present invention as described herein may pertain to a support article comprising vias, which extend all the way through the dielectric layer, thereby forming an opening through the dielectric layer. Although the embodiments herein typically describe a single LESD or a single site on a support article for attaching an LESD, it is to be understood that the invention covers multiple LESDs and support articles with multiple sites for attaching LESDs. Additionally, the embodiments herein may include additional vias throughout the dielectric layer, for example, adjacent to the attached LESDs, to provide additional heat dissipation features.

Figure 1:
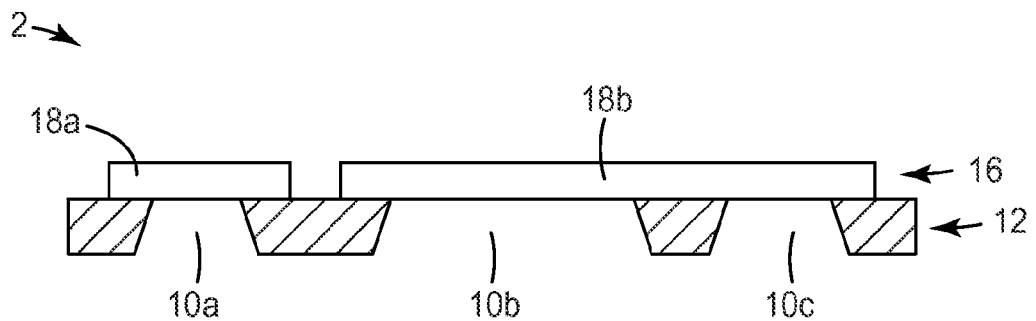
FIG. 1 depicts a side view of an embodiment of an article of the present invention.

FIG. 1 illustrates a side view of an embodiment of support article 2 in which three vias 10a, 10b, and 10c (collectively referred to in some instances as vias 10) extend from the second surface to the first surface of dielectric layer 12. In most embodiments, the via openings at the second surface are larger than the via openings at the first surface. This is typically due to the sloped side walls of the via. The sloped side walls are typically a result of the etching method used to form the vias. However, sloped side walls may also be formed by certain via drilling methods. Conductive layer 16 is on the first surface of dielectric layer 12. In many embodiments, there is no conductive layer on the second surface of dielectric layer 12. However, the article may have a conductive layer on the second surface of dielectric layer. Conductive layer 16 is patterned on the first surface of dielectric layer 12 and includes conductive features 18a and 18b (collectively referred to in some instances as conductive features 18), electrically isolated from each other. Conductive feature 18a is located generally above via 10a and will be electrically and thermally connected to any electrically and thermally conductive material located in via 10a. Conductive feature 18b is located generally above both of vias 10b and 10c and will be electrically and thermally connected to any electrically and thermally conductive material located in vias 10b and 10c.

Figure 2:
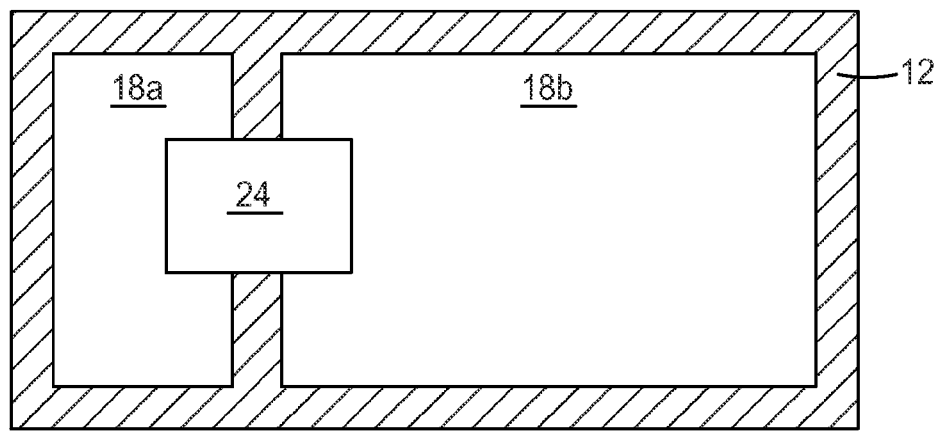
FIG. 2 depicts a top view of the embodiment of FIG. 1.
Figure 3:
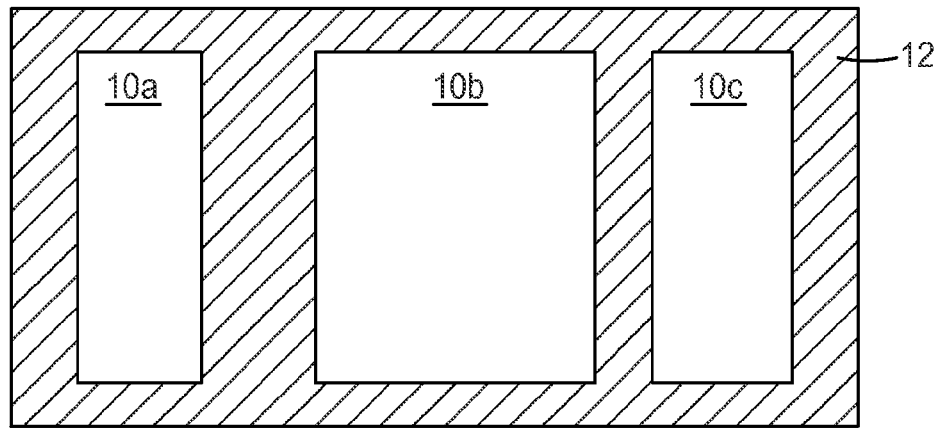
FIG. 3 depicts a bottom view of the embodiment of FIG. 1.

FIGS. 2 and 3 respectively illustrate a top view and bottom view of the support article 2 of FIG. 1.

Figure 4:
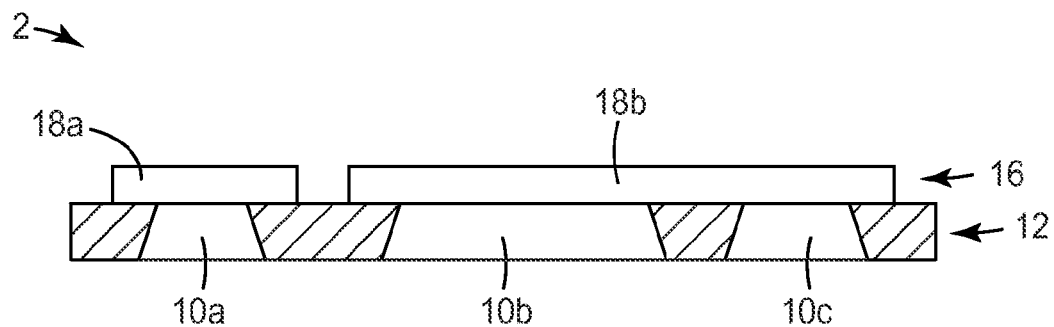
FIG. 4 depicts a side view of an embodiment of an article of the present invention.
Figure 5:
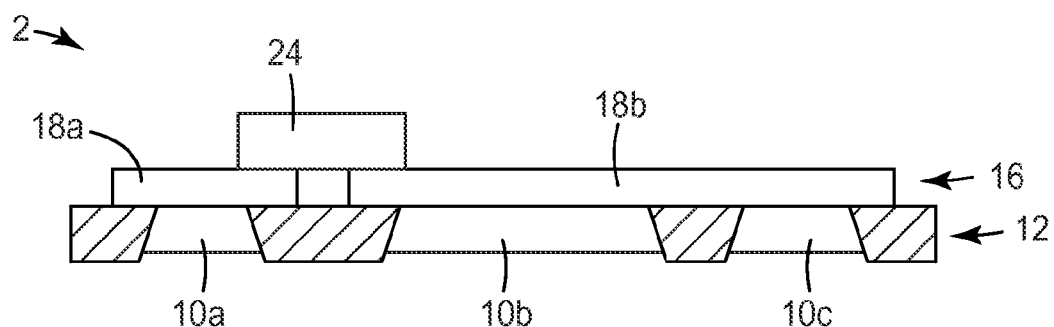
FIG. 5 depicts a side view of an embodiment of an article of the present invention.
Figure 6:
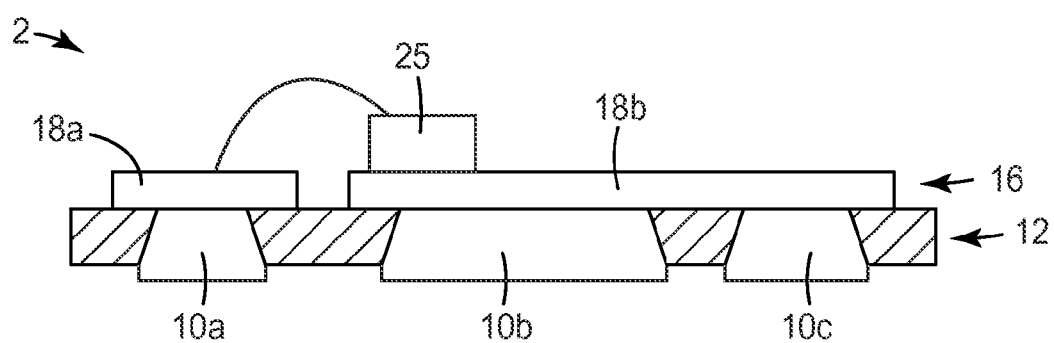
FIG. 6 depicts a side view of an embodiment of an article of the present invention.

As illustrated in FIGS. 4-5, vias 10 may contain conductive material 20, which may be any electrically conductive material, such as solder paste, solder balls, silver paste, copper, and the like. FIG. 4 illustrates an embodiment in which conductive material 20 is substantially co-planar with the second surface of dielectric layer 12. FIG. 5 illustrates an embodiment in which conductive material 20 does not extend all the way to the second surface of dielectric layer 12. In the embodiment of FIG. 5, conductive material 20 can be recessed from the second surface of dielectric layer 12 by any suitable distance. FIG. 6 illustrates an embodiment in which conductive material 20 extends beyond the second surface of dielectric layer 12. In the embodiment of FIG. 6, conductive material 20 may extend any suitable distance beyond the second surface of dielectric layer 12. In some embodiments, a suitable distance is between 0 and about 100 micrometers.

Support article 2 is suitable for use with various types of LESDs. FIG. 5 further illustrates an embodiment in which a flip chip LESD 24 is attached to conductive features 18a and 18b of support article 2. FIG. 6 further illustrates an embodiment in which a bottom contact of wire bond LESD 25 is attached to conductive feature 18b and a top contact is wire bonded to conductive feature 18b. The conductive features 18 and the conductive material 20 in vias 10 act as anode and cathode electrodes for the LESD. In the illustrated embodiments, conductive feature 18a and via 10a act together as an anode or cathode electrode while conductive feature 18b and vias 10b and 10c act together as the opposite electrode.

Figure 7:
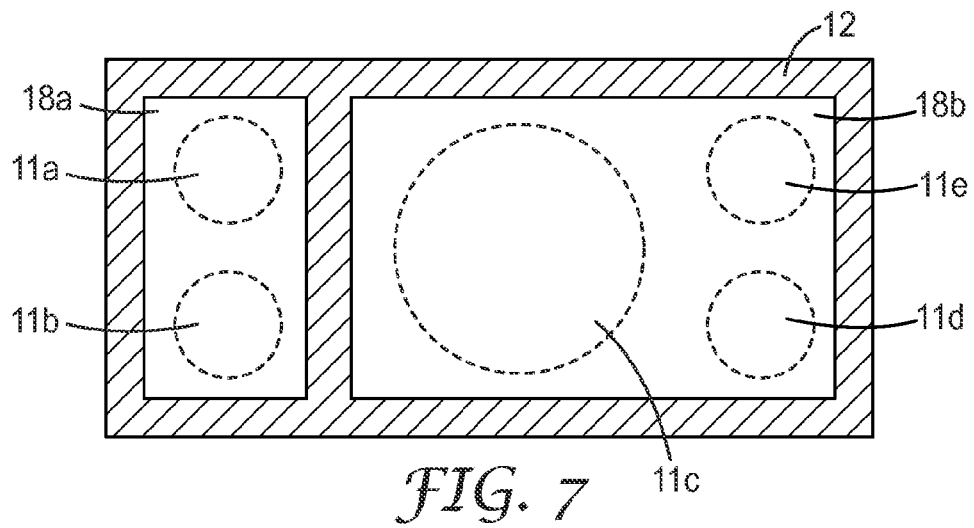
FIG. 7 depicts a top view of an embodiment of an article of the present invention.
Figure 8:
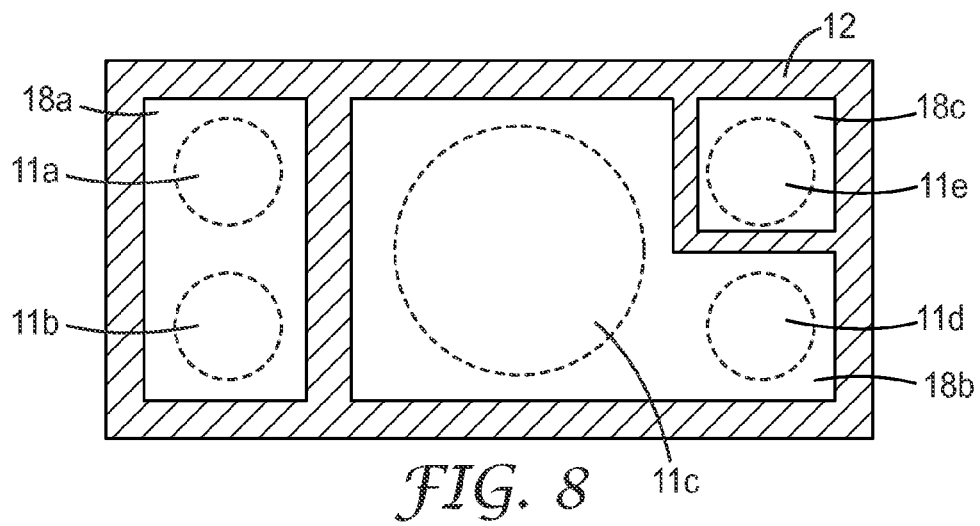
FIG. 8 depicts a top view of an embodiment of an article of the present invention.
Figure 9:
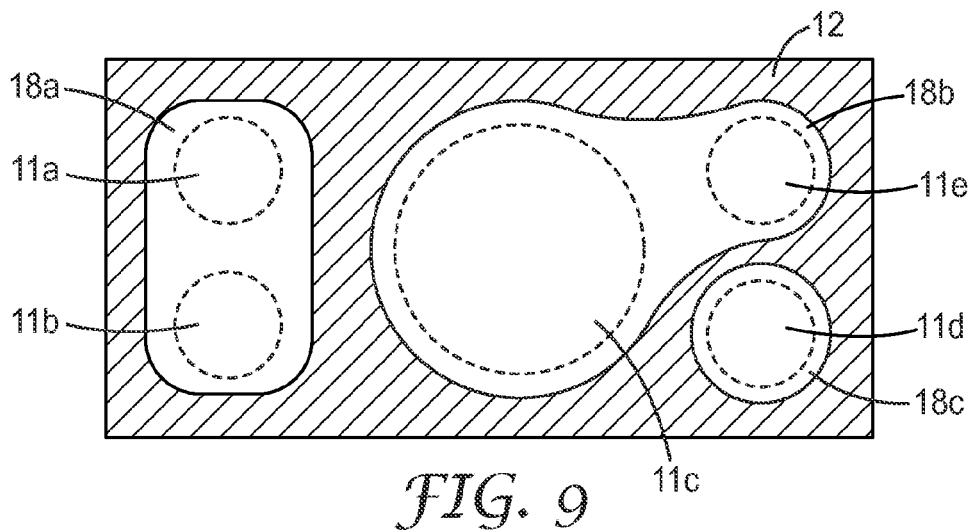
FIG. 9 depicts a top view of an embodiment of an article of the present invention.

FIGS. 7-9 illustrate alternate embodiments in which support article 2 comprises five vias.

FIG. 7 illustrates an embodiment of support article 2 in which five vias 11a, 11b, 11c, 11d, and 11e (collectively referred to in some instances as vias 11) extend from the second surface to the second surface of dielectric layer 12. Conductive features 18a and 18b (collectively referred to in some instances as conductive features 18) are patterned on the first surface of dielectric layer 12 and are electrically isolated from each other. Conductive feature 18a is located generally above via 11a and 11b and will be electrically and thermally connected to any electrically and thermally conductive material located in vias 11a and 11b. Conductive feature 18b is located generally above vias 11c, 11d, and 11e, and will be electrically and thermally connected to any electrically and thermally conductive material located in vias 11c, 11d, and 11e.

FIG. 8 illustrates an embodiment of support article 2 similar to that of FIG. 7. In FIG. 8, conductive feature 18a is located generally above via 11a and 11b and will be electrically and thermally connected to any electrically and thermally conductive material located in vias 11a and 11b. Conductive feature 18b is located generally above vias 11c and 11d, and will be electrically and thermally connected to any electrically and thermally conductive material located in vias 11c and 11d. Conductive feature 18c is located generally above via 11e and will be electrically and thermally connected to any electrically and thermally conductive material located in via 11e. Conductive features 18a, 18b and 18c are electrically isolated from each other.

FIG. 9 illustrates an embodiment of support article 2 similar to that of FIG. 8. In FIG. 9, conductive feature 18a is located generally above via 11a and 11b and will be electrically and thermally connected to any electrically and thermally conductive material located in vias 11a and 11b. Conductive feature 18b is located generally above vias 11c and 11e, and will be electrically and thermally connected to any electrically and thermally conductive material located in vias 11c and 11e. Conductive feature 18c is located generally above via 11d and will be electrically and thermally connected to any electrically and thermally conductive material located in via 11d. Conductive features 18a, 18b and 18c are electrically isolated from each other. FIG. 9 also illustrates that conductive features 18a-18c are not limited to any particular shape. They may be any shape suitable for the intended use of support article 2.

In an alternate embodiment of support article 2 (not shown), conductive feature 18a is located generally above via 11a and 11b and will be electrically and thermally connected to any electrically and thermally conductive material located in vias 11a and 11b. Conductive feature 18b is located generally above via 11c, and will be electrically and thermally connected to any electrically and thermally conductive material located in vias 11c. Conductive feature 18c is located generally above vias 11d and 11e and will be electrically and thermally connected to any electrically and thermally conductive material located in vias 11d and 11e. Conductive features 18a, 18b and 18c are electrically isolated from each other.

In some embodiment, a solder mask (not shown) may be applied over conductive layer 16, leaving an opening for the LESD. A reflective solder mask (not shown) may optionally be used.

In alternate embodiments, there may be any number of vias 10 electrically and optionally thermally connected to a conductive feature 18, so long as at least two adjacent conductive features are electrically separated from each other and suitable for mounting an LESD, including flip chip LESDs and wire bond LESDs.

Suitable dielectric layers for the present invention include polyesters, polycarbonates, liquid crystal polymers, and polyimides. Polyimides are preferred. Suitable polyimides include those available under the trade names KAPTON, available from DuPont; APICAL, available from Kaneka Texas corporation; SKC Kolon PI, available from SKC Kolon PI Inc.; and UPILEX and UPISEL, available from Ube-Nitto Kasei Industries, Japan. Most preferred are polyimides available under the trade designations UPILEX S, UPILEX SN, and UPISEL VT, all available from Ube-Nitto Kasei Industries. These polyimides are made from monomers such as biphenyl tetracarboxylic dianhydride (BBDA) and phenyl diamine (PDA). In at least one embodiment, the thickness of the dielectric layer is preferably 50 micrometers or less, but may be any thickness suitable for a particular application.

The dielectric layers (substrates) may be initially clad on one side with a conductive layer. If the conductive layer is to be formed into circuits, it may be pre-patterned, or may be patterned during the process of making the support articles. The conductive layer may be any suitable material including copper, gold, nickel/gold, silver, aluminum, and stainless steel, but is typically copper. The conductive layer may be applied in any suitable manner such as sputtering, plating, chemical vapor deposition, or it may be laminated to the dielectric layer or attached with an adhesive.

Vias may be formed in the dielectric layer using any suitable method such as chemical etching, plasma etching, focused ion-beam etching, laser ablation, embossing, microreplication, injection molding, and punching. Chemical etching may be preferred in some embodiments. Any suitable etchant may be used and may vary depending on the dielectric layer material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in U.S. Provisional Patent Application No. 61/409,791, incorporated herein by reference. Subsequent to etching, the dielectric layers may be treated with an alkaline KOH/potassium permanganate (PPM) solution, e.g., a solution of about 0.7 to about 1.0 wt % KOH and about 3 wt % KMnO4.

The side wall angles resulting from chemical etching varies, and is most dependent on etch rate, with slower etching rates resulting in shallower side wall angles. Typical side wall angles resulting from chemical etching are about 5° to about 60°, and in at least one embodiment, about 25° to about 28°. For purposes of this application, a sloped side wall means a side wall that is not perpendicular to the horizontal plane of the dielectric layer. Vias or cavities with sloped sidewalls could also be made using methods such as embossing, microreplication, and injection molding. Vias having sloped sidewalls may also be made with methods such as punching, plasma etching, focused ion-beam etching, and laser ablation; however, with these methods, the side walls typically have a steeper angle, e.g., up to 90°.

If the vias in embodiments of the present invention have a conductive layer adjacent one opening, it can be filled with conductive material by electrodeposition, such as electroplating, by building up conductive material on the surface of the conductive layer facing the via. Alternatively, it can be filled with conductive materials such as solder.

The discrete LESDs can be made in a batch process or a continuous process such as a roll-to-roll process that is often used in making flexible circuits. Arrays of LESDs can be formed in any desired pattern on the flexible substrate. The LESDs can then be divided as desired, e.g., singulated into individual LESDs, strips of LESDs, or arrays of LESDs, e.g., by stamping or by slitting the substrate. Accordingly, an entire reel of LESDs on a flexible substrate can be shipped without the need for the traditional tape and reel process in which individual LESDs are typically transported in individual pockets of a carrier tape.

The support articles can also be made in a batch process or a continuous process such as a roll-to-roll process that is often used in making flexible circuits. The support articles can be formed with any desired pattern of LESD attachment sites on the flexible substrate. The support articles can then be divided as desired, e.g., singulated to provide individual LESD attachment sites, strips of LESD attachment sites, or arrays of LESD attachment sites, e.g., by stamping or by slitting the substrate.

Before or after forming support articles with individual, strips, or arrays of LESD attachment sites, the support articles can be attached to an additional substrate, for example with a thermal interface material (TIM) such as a thermally conductive adhesive. Any suitable TIM may be used in embodiments of the present invention. Depending on the embodiment, the TIM may be applied to the support article as a liquid, paste, gel, solid, etc. Suitable methods for applying TIM depend on the properties of the specific TIM, but include precision coating, dispensing, screen printing, lamination etc.

Suitable methods for curing a curable TIM include UV curing, thermal curing etc.

The TIM may be coated on, e.g., as a liquid or a semi-solid such as a gel or paste, or may be laminated on in sheet form. A combination of TIMs could be used. In some embodiments, the TIM may also be adhesive-based. In such an embodiment, the TIM could adhere directly to the support article on one side and a thermally conductive substrate on the other. A TIM that does not have adhesive properties could be applied to one or both of the substrate article and the thermally conductive substrate with a thermally conductive adhesive. The TIM may be first applied to the substrate article and a thermally conductive substrate applied to the TIM thereafter, or the TIM may be first applied to a conductive substrate and the TIM-coated conductive substrate applied to the substrate article thereafter.

The TIM can further facilitate the transfer of heat away from the LESDs, once attached to the support article. The support articles can be attached to any desired substrate, depending on their intended use. The additional substrate may be thermally and/or electrically conductive or may be a semiconductor, ceramic, or polymeric substrate, which may or may not be thermally conductive. For example, the additional substrates can be flexible or rigid metal substrates, such as copper or aluminum, heat sinks, dielectric substrates, circuit boards, etc.

If the flexible LESDs (comprising both the support article and discrete LESDs) are for use as a lighting strip, they could be enclosed in a waterproof/weatherproof, transparent casing, as described above.

If the flexible LESDs are in strip or array form, the discrete LESDs may be electrically connected to one or more of the other discrete LESDs in the strip or array. Additional elements such as Zener diodes and Schottky diodes can also be added to the top or bottom surface of the support article, e.g. using direct wafer bonding or flip chip processes. These elements may also be electrically connected to the LESDs.

In at least one embodiment of the present invention, the flexible LESDs are thinner than conventional single or multiple LESD submounts because the flexible LESD has a one metal layer construction and because LESD sits over two adjacent solder-filled vias in the support article. This enables the flexible LESDs of the present invention to be used in applications with tight volume restrictions, such as cell phones and camera flashes Moreover, the support articles of the present invention can be flexed or bent to easily fit into a non-linear or non-planar assembly if desired.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. A support article comprising:
   a dielectric layer having a first major surface with a conductive layer thereon and a second major surface, the dielectric layer having at least three vias extending from the second major surface to the first major surface, the conductive layer comprising at least first and second conductive features, wherein the first conductive feature is adjacent an opening of at least a first via and the second conductive feature is adjacent an opening of at least a second and a third via and wherein the via openings at the second surface are larger than the via openings at the first surface, wherein the at least three vias contain conductive material, and wherein the conductive material in at least one of the vias extends beyond the second surface of the dielectric layer.

2. The support article of claim 1 wherein the conductive material is selected from the group consisting of solder paste, solder balls, silver paste, and copper.

3. The support article of claim 1 wherein the conductive material in at least one of the vias is co-planar with the second surface of the dielectric layer.

4. The support article of claim 1 wherein the conductive material in at least one of the vias does not extend to the second surface of the dielectric layer.

5. The support article of claim 1 wherein the conductive material in each of the vias extends beyond the second surface of the dielectric layer.

6. The support article of claim 1 wherein the first and second conductive features comprise electrodes.

7. The support article of claim 6 wherein the first conductive feature is an anode and the second conductive feature is a cathode.

8. The support article of claim 6 wherein the first conductive feature is a cathode and the second conductive feature is an anode.

9. The support article of claim 1 further comprising an LESD in electrical contact with the first and second conductive features.

10. The support article of claim 9 wherein the LESD is a flip chip.

11. The support article of claim 9 wherein the LESD is a wire bond chip.

12. The support article of claim 1 wherein the dielectric layer is flexible.

13. The support article of claim 1 wherein the dielectric layer is polymeric.

14. The support article of claim 1 wherein the dielectric layer has at least four vias extending from the second major surface to the first major surface, the first conductive feature is adjacent an opening of at least a first via and the second conductive feature is adjacent an opening of at least a second, third, and fourth via.

15. The support article of claim 1 wherein the dielectric layer has at least four vias extending from the second major surface to the first major surface, the first conductive feature is adjacent an opening of at least a first and a second via and the second conductive feature is adjacent an opening of at least a third and fourth via.

16. The support article of claim 1 wherein the dielectric layer has at least five vias extending from the second major surface to the first major surface, the first conductive feature is adjacent an opening of at least a first and a second via and the second conductive feature is adjacent an opening of at least a third, fourth, and fifth via.

17. The support article of claim 1 wherein the dielectric layer has at least five vias extending from the second major surface to the first major surface, the first conductive feature is adjacent an opening of at least a via and the second conductive feature is adjacent an opening of at least a second, third, and fourth via; the conductive layer comprising a third conductive feature adjacent a fifth via.

18. The support article of claim 1 wherein the dielectric layer has at least five vias extending from the second major surface to the first major surface, the first conductive feature is adjacent an opening of at least a first and a second via and the second conductive feature is adjacent an opening of at least a third and fourth via; the conductive layer comprising a third conductive feature adjacent a fifth via.

* * * * *